(12) United States Patent
Iwami

(10) Patent No.: US 8,552,531 B2
(45) Date of Patent: Oct. 8, 2013

(54) NITRIDE-BASED COMPOUND SEMICONDUCTOR AND NITRIDE-BASED COMPOUND SEMICONDUCTOR DEVICE

(75) Inventor: Masayuki Iwami, Kanagawa (JP)

(73) Assignee: Advanced Power Device Research Association, Kanagawa (JP)

( * ) Notice: Subject to any disclaimer, the term of this patent is extended or adjusted under 35 U.S.C. 154(b) by 38 days.

(21) Appl. No.: 13/180,635

(22) Filed: Jul. 12, 2011

(65) Prior Publication Data

US 2012/0049182 A1 Mar. 1, 2012

(30) Foreign Application Priority Data

Aug. 30, 2010 (JP) ................................ 2010-192553

(51) Int. Cl.
*H01L 21/70* (2006.01)
(52) U.S. Cl.
USPC .... 257/547; 257/200; 257/615; 257/E33.025; 438/604
(58) Field of Classification Search
USPC ........... 257/200, 547, 615, E33.025; 438/604
See application file for complete search history.

(56) References Cited

U.S. PATENT DOCUMENTS

| | | | | |
|---|---|---|---|---|
| 7,126,426 B2 * | 10/2006 | Mishra et al. | ................ | 330/307 |
| 7,170,095 B2 * | 1/2007 | Vaudo et al. | .................... | 257/76 |
| 7,803,717 B2 * | 9/2010 | Rawdanowicz et al. | ....... | 438/758 |
| 2008/0258150 A1 * | 10/2008 | McCarthy et al. | .............. | 257/76 |

FOREIGN PATENT DOCUMENTS

| | | |
|---|---|---|
| JP | 2007-251144 A | 9/2007 |
| JP | 2008533738 A | 8/2008 |
| JP | 2008251966 A | 10/2008 |
| JP | 2008545270 A | 11/2008 |
| JP | 2009176929 A | 6/2009 |
| WO | 2006101598 A2 | 9/2006 |
| WO | 2007005074 A1 | 1/2007 |

OTHER PUBLICATIONS

John E. Northrup, "Screw dislocations in GaN: The Ga-filled core model," Applied Physics Letter, pp. 2288-2290, vol. 78, No. 16, Apr. 16, 2001.
J.W.P. Hsu et al., "Direct imaging of reverse-bias leakage through pure screw dislocations in GaN films grown by molecular beam epitaxy on GaN templates," Applied Physics Letters, pp. 79-81, vol. 81, No. 1, Jul. 1, 2002.
Office Action issued Jul. 13, 2012 in Japanese Application No. 2010-192553, 5 pages.

* cited by examiner

*Primary Examiner* — Jarrett Stark
*Assistant Examiner* — Nicholas Tobergte
(74) *Attorney, Agent, or Firm* — Lowe, Hauptman & Ham

(57) ABSTRACT

A nitride-based compound semiconductor includes an atom of at least one group-III element selected from the group consisting of Al, Ga, In, and B, a nitrogen atom, and a metal atom that forms a compound by bonding with an interstitial atom of the at least one group-III element. The metal atom is preferably iron or nickel. A doping concentration of the metal atom is preferably equal to a concentration of the interstitial atom of the at least one group-III element.

10 Claims, 15 Drawing Sheets

US 8,552,531 B2

NITRIDE-BASED COMPOUND SEMICONDUCTOR AND NITRIDE-BASED COMPOUND SEMICONDUCTOR DEVICE

The contents of the following, Japanese patent application are incorporated herein by reference: No. 2010-192553 filed on Aug. 30, 2010.

BACKGROUND

1. Technical Field

The present invention relates to nitride-based compound semiconductor and a nitride-based compound semiconductor device.

2. Related Art

Nitride-based compound semiconductors, such as GaN-based semiconductor, have greater bandgap energy and breakdown voltage than silicon-based material, and therefore nitride-based compound semiconductor can be used to manufacture a semiconductor device with high breakdown voltage that can operate in high-temperature environments. Accordingly, the nitride-based compound semiconductors are expected to be used for power devices, such as inverters and converters, replacing the silicon-based material.

In the power devices, high OFF breakdown voltage is an important parameter for determining the maximum output of a transistor. In order to achieve the high OFF breakdown voltage, it is necessary to decrease the leak current and improve the buffer breakdown voltage.

The GaN-based semiconductor is generally hetero-epitaxially grown on a heterogeneous substrate, and therefore the GaN-based semiconductor includes lots of lattice defects including dislocations and point defects such as nitrogen vacancies. In particular, if a silicon substrate is used, the lattice constant difference between GaN and silicon is approximately as large as 17% and the thermal expansion coefficient difference is approximately as large as 56%. Therefore, dislocations occur with a high density exceeding $10^{10}$ cm$^{-2}$. A GaN-based semiconductor device with such high-density dislocation exhibits large leak current and low breakdown voltage.

One of the techniques for increasing the breakdown voltage is to increase the resistance of a buffer layer formed directly on the substrate. As a method to increase the resistance of the buffer layer, an auto-doping method has been proposed, in which carbon contained in an organic metal, which is the raw material, is used as a dopant when using the metal organic chemical vapor deposition (MOCVD) (see, for example, Japanese Patent Application Laid-open No. 2007-251144, J. E. Northrup, Appl. Phys. Lett., vol. 78, p. 2200 (2001), and J. W. P. Hsu, M. j. Manfra, R. J. Molnar, B. Heying, and J. S. Spec, Appl. Phys. Lett., vol. 81, p. 79 (2002)).

When considering reliability of a device, it is preferable that the leak current be prevented from increasing not only at the initial time of using the device but also for a long term period of operation exceeding 1000 hours. However, in a device whose buffer layer has increased resistance due to carbon doping, such as the device disclosed in Japanese Patent Application Laid-open No. 2007-251144, even though the leak current at the initial time of using the device, i.e. the initial value of the leak current, is no greater than a predetermined value, the leak current increases with time.

The present invention has been achieved in view of the above problems, and it is an object of the present invention to provide nitride-based compound semiconductor and a nitride-based compound semiconductor device that have high long-term reliability.

SUMMARY

According to one aspect of the present invention, there is provided a nitride-based compound semiconductor including an atom of at least one group-III element selected from the group consisting of Al, Ga, In, and B, a nitrogen atom, and a metal atom that forms a compound by bonding with an interstitial atom of the at least one group-III element.

According to another aspect of the present invention, there is provided a nitride-based compound semiconductor device including a heterogeneous substrate with respect to a nitride-based compound semiconductor and a semiconductor layer of the nitride-based compound semiconductor epitaxially grown on the substrate. The nitride-based compound semiconductor includes an atom of at least one group-III element selected from the group consisting of Al, Ga, In, and B, a nitrogen atom, and a metal atom that forms a compound by bonding with an interstitial atom of the at least one group-III element.

The present invention can suppress the increase of leak current even during long-term conduction, and can therefore realize nitride-based compound semiconductor and a nitride-based compound semiconductor device that have high long-term reliability.

The summary clause does not necessarily describe all necessary features of the embodiments of the present invention. The present invention may also be a sub-combination of the features described above.

BRIEF DESCRIPTION OP THE DRAWINGS

Figure 13:
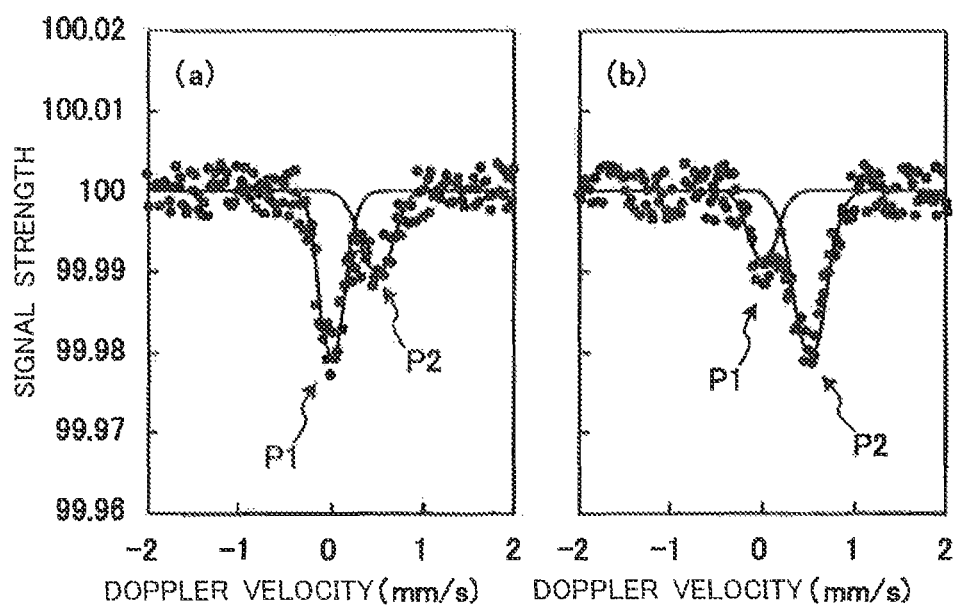
Figure 14:
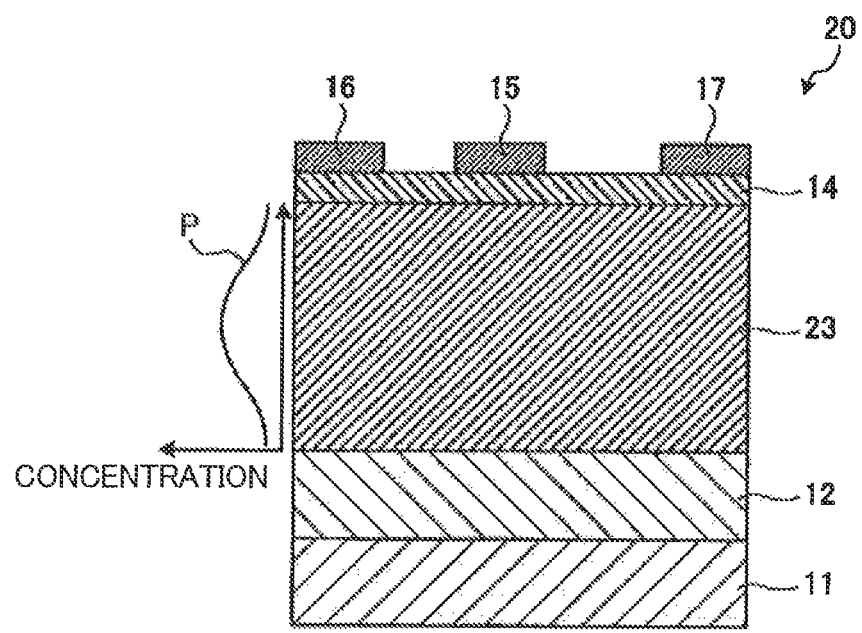

FIGS. 13A an 13B show Mossbauer spectrums of $^{57}$Fe in the HFET according to the first embodiment example;

FIG. 14 is a schematic cross-sectional view of an HFET according to a third embodiment of the present invention; and FIGS. 15A to 15D show an example of a process for manufacturing the HFET shown in FIG. 14.

DESCRIPTION OF EXEMPLARY EMBODIMENTS

Exemplary embodiments of the present invention will be described in detail below with reference to accompanying drawings. However, the embodiments should not be construed to limit the invention. All the combinations of the features described in the embodiments are not necessarily essential to means provided by aspects of the invention.

The leak current occurring in nitride-based compound semiconductor is thought to be caused by the formation of leak paths along dislocation lines of "screw dislocations" that are present in the crystal of the nitride-based compound semiconductor. This is because, as predicted by the results of the first-principles calculation of electronic states (see J. E. Northrup, Appl. Phys. Lett., vol. 78, p. 2200 (2001)), the Ga-rich screw dislocation core has multiple levels in the bandgap, and so current flows when a high voltage is applied. The "Ga-rich screw dislocation core" means that the amount of Ga atoms in the screw dislocation core is no less than 50 wt %.

An increase of the leak current when a reverse bias is applied on the screw dislocation is observed by a current atomic force microscope (AFM), and this supports the prediction of J. E. Northrup (see J. W. P. Hsu, M. J. Manfra, R. J. Molnar, B. Heying, and J. S. Spec, Appl. Phys. Lett., vol. 81, p. 79 (2002)).

However, while the two documents mentioned above can describe the magnitude of the initial value of the leak current in a specific nitride-based compound semiconductor, these documents do not provide any insight into the leak current increase caused by a long-term operation.

The inventors of the present invention performed the following calculations for GaN crystal, in order to identify the mechanism causing the leak current increase.

Calculation 1: Comparison between electronic states of Ga-rich screw dislocation and open-core screw dislocation.

The dislocation core structure of screw dislocations in GaN can be roughly divided into two types: a Ga-rich structure; and an open-core structure in which atoms of the dislocation core are deficient. In Calculation 1, the first-principles calculation of the electronic states was performed for each structure, based on the local density approximation (LDA).

This calculation used Advance/PHASE produced by Advanced Soft, Ltd. The calculation also used Vanderbilt Ultrasoft pseudopotential. The exchange interaction was calculated in a range of the generalized gradient approximation (GGA). The spin was taken into consideration in the calculation. The calculation conditions are as follows.

Cutoff energy: Respectively 25 Ry and 230 Ry for the wave function and the charge density distribution
k-point sample: 3×3×2
Number of calculated bands: 228

Figure 1:
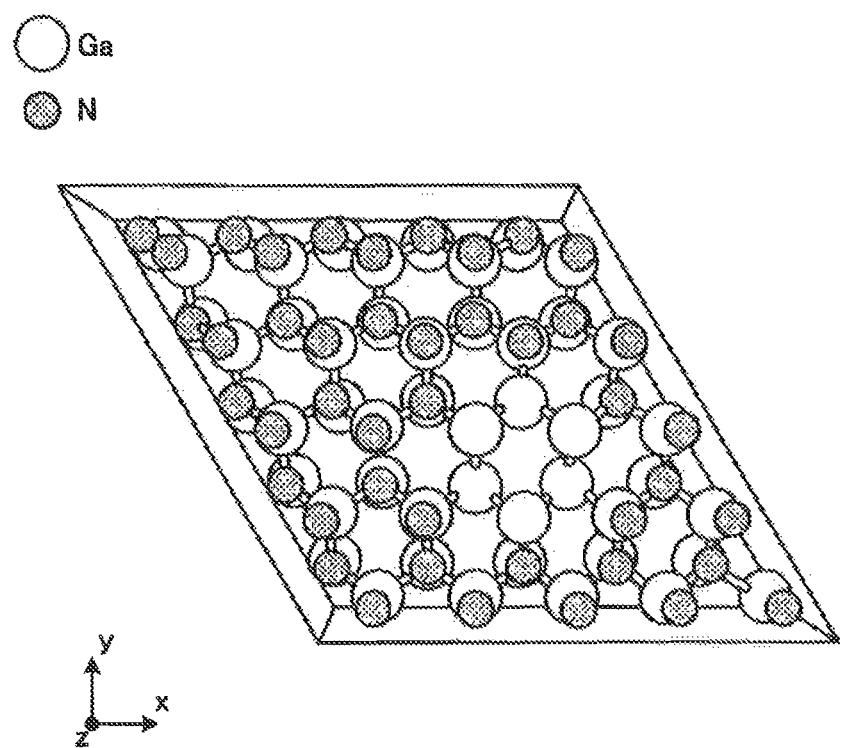
FIG. 1 shows a Ga-rich dislocation core structure of a screw dislocation.
Figure 2:
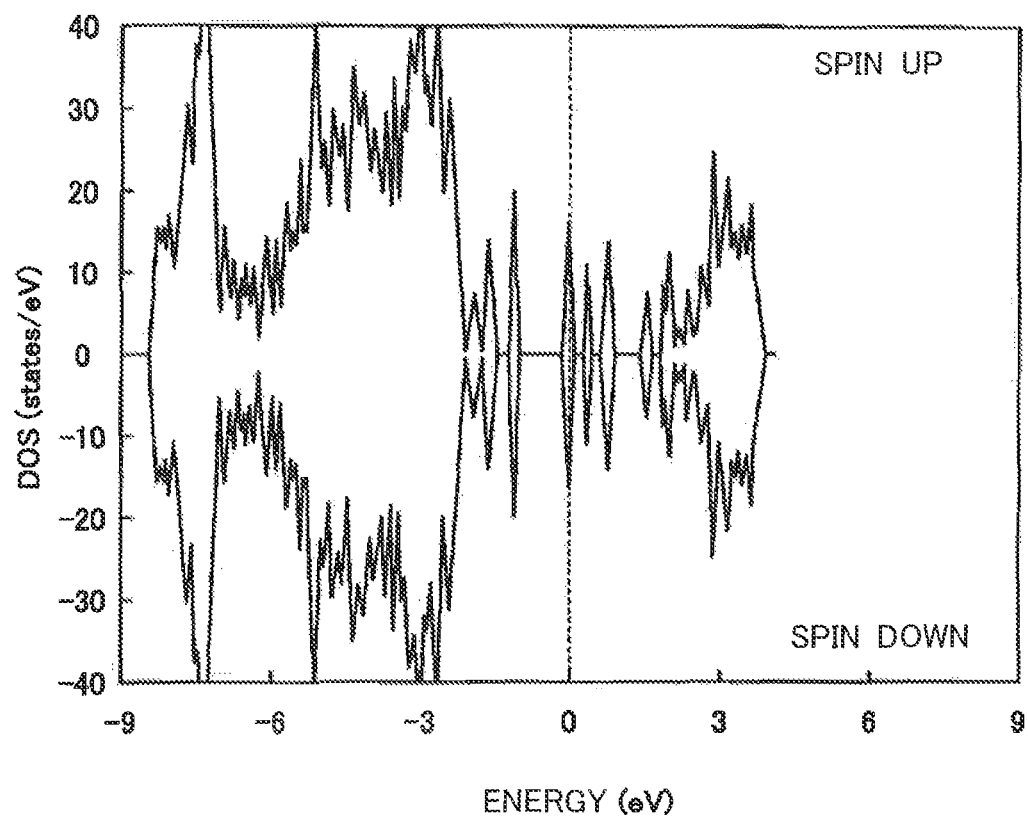
FIG. 2 shows electron density of states (DOS) calculated using the atomic model of the dislocation core structure shown in FIG. 1.
Figure 3:
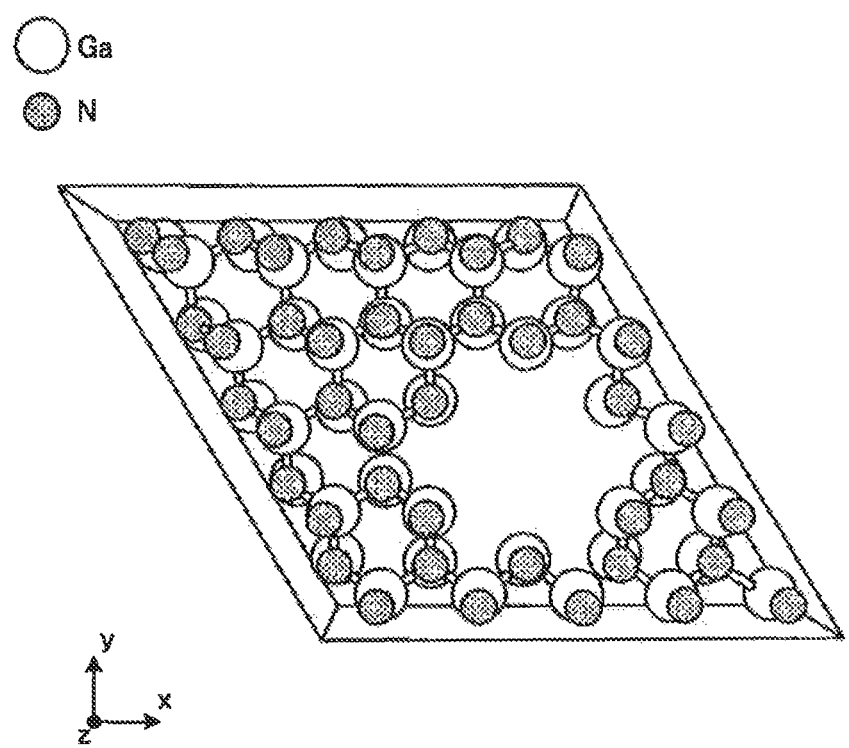
FIG. 3 shows an open-core dislocation core structure of a screw dislocation.
Figure 4:
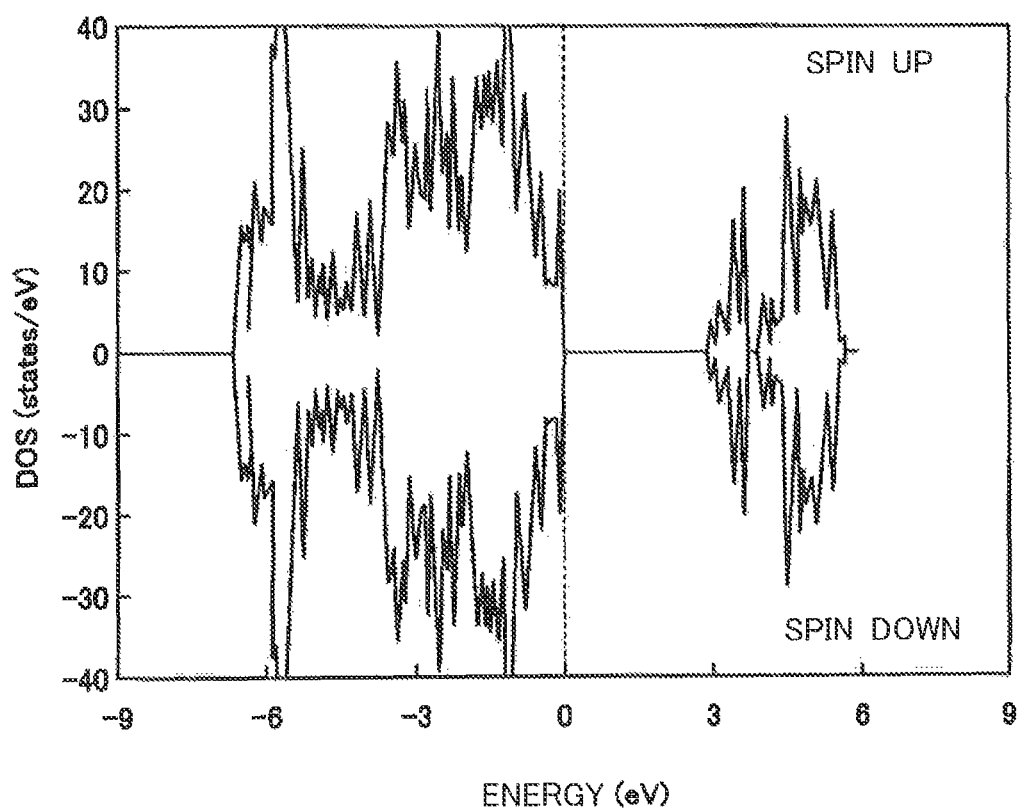
FIG. 4 shows DOS calculated using the atomic model of the dislocation core structure shown in FIG. 3.

FIG. 1 shows a Ga-rich dislocation core structure of a screw dislocation. FIG. 2 shows electron density of states (DOS) calculated using the atomic model of the dislocation core structure shown in FIG. 1. FIG. 3 shows an open-core dislocation core structure of a screw dislocation. FIG. 4 shows DOS calculated using the atomic model of the dislocation core structure shown in FIG. 3. In FIGS. 2 and 4, the horizontal axis represents electron energy, and the position where the energy is zero indicates the Fermi level. Furthermore, a positive sign of the DOS indicates the spin-up DOS and a negative sign of the DOS indicates the spin-down DOS.

As shown in FIGS. 1 and 2, the Ga-rich screw dislocation has discrete energy levels in the bandgaps within a range on the horizontal axis from approximately −2 eV to approximately +1.6 eV. In other words, this shows that the Ga-rich screw dislocation can form a leak path, since the energy levels exist in these bandgaps. This result matches the results of the documents described above.

On the other hand, as shown in FIGS. 3 and 4, the open-core screw dislocation does not have energy levels in a range on the horizontal axis from 0 eV to +3 eV. In other words, this shows that the open-core screw dislocation does not form a leak path.

These results show that it is possible for the Ga-rich screw dislocation to form a leak path, and that the open-core screw dislocation doe not form a leak path.

Based on these results, the inventors of the present invention hypothesized that the open-core screw dislocations in a crystal are changed into the Ga-rich screw dislocations by an application of the current, thereby causing an increase in the leak current. Therefore, the inventors of the present invention performed the following calculations.

Calculation 2: Confirmation of the open-core screw dislocation changing into the Ga-rich screw dislocation due to absorption of Ga interstitials.

The cause of the open-core screw dislocation changing into the Ga-rich screw dislocation is believed to be the absorption of Ga interstitials into the screw dislocation core, in order to investigate this point, the behavior of Ga atoms arranged near the dislocation core was checked using a molecular dynamics calculation. The calculation of a stable atom arrangement was performed using quenched MD with a step increment of 1.2 fs.

FIGS. 5A to 6B show the behavior of Ga atoms near the dislocation cores.

Figure 5A:
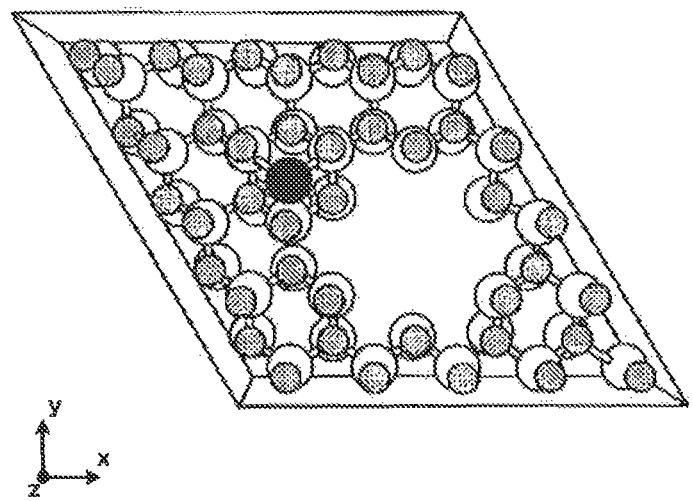
FIGS. 5A to 6B show behavior of Ga atoms near dislocation cores.

As shown in FIG. 5A, a Ga atom represented by a black circle is arranged near the open-core screw dislocation core (at a distance of approximately 0.15 nm from the core, for example) having a stable structure. In this case, as shown in FIG. 5B, the Ga atom is absorbed in the open-core screw dislocation core, as represented by a shaded circle.

Figure 6A:
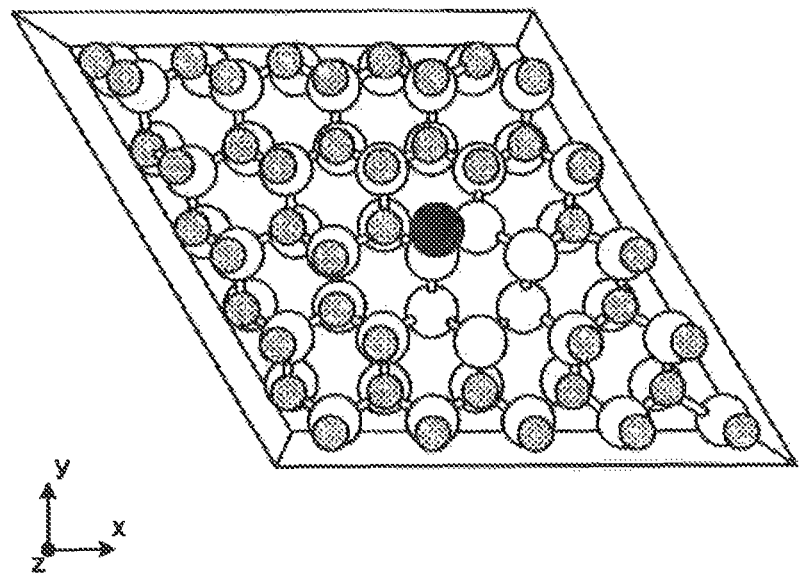
Figure 6B:
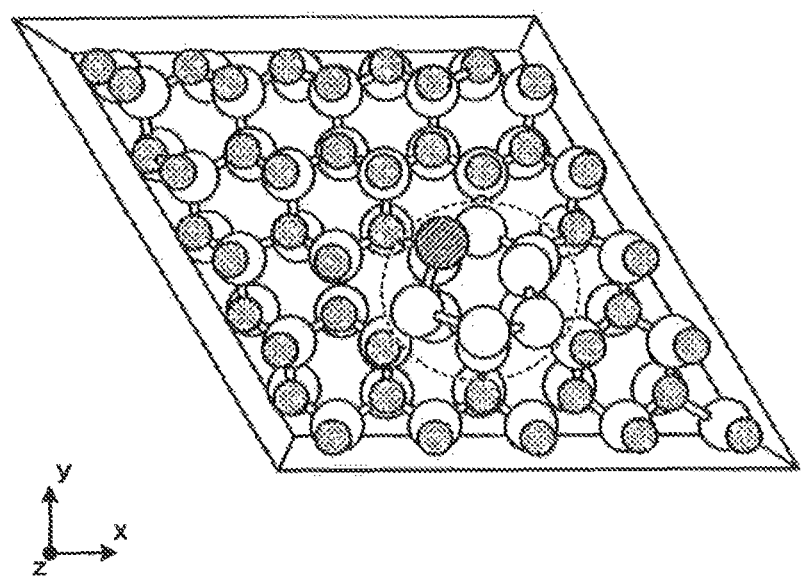

As shown in FIG. 6A, when a Ga atom is slightly displaced outward (by a distance of approximately 0.1 nm, for example) from the Ga-rich screw dislocation core having a stable structure, the Ga atom is absorbed in the dislocation core. Furthermore, the Ga interstitials near the screw dislocation core are absorbed in the same way, and as shown in FIG. 6B, an excess of Ga atoms are present in the dislocation core, as represented by the region bounded by the dashed line.

Figure 5B:
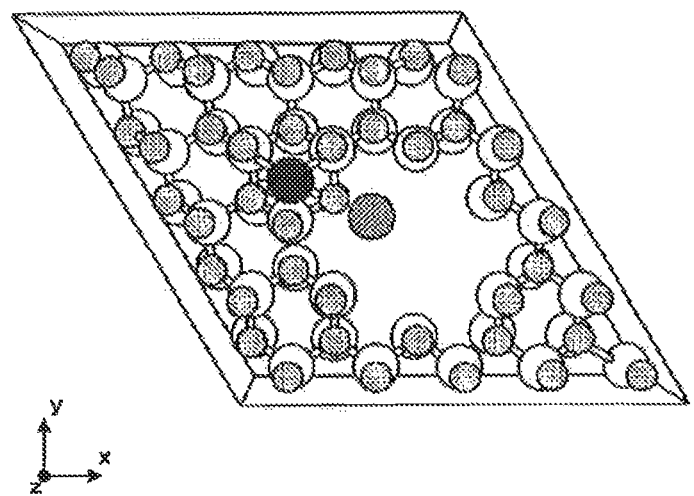
Figure 7:
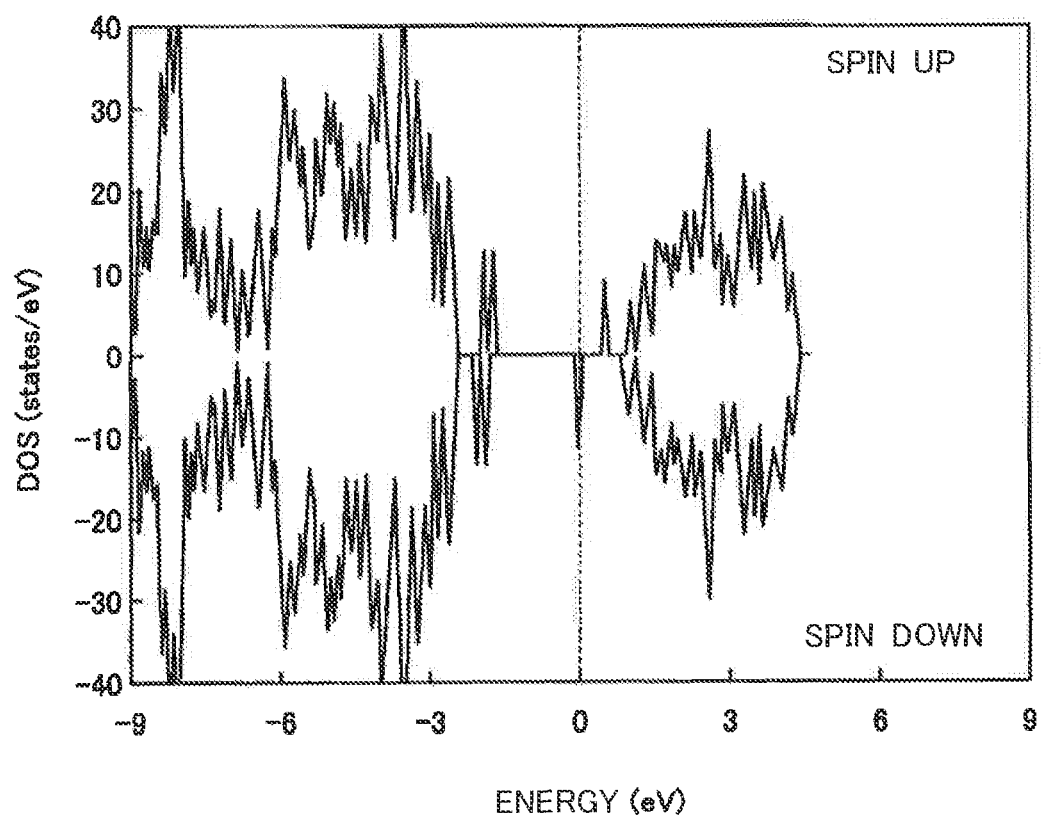
FIG. 7 shows DOS calculated using the atomic model of the dislocation core structure shown in FIG. 5B.

FIG. 7 shows DOS calculated using the atomic model of the dislocation core structure shown in FIG. 5B. As shown in FIG. 7, the dislocation core structure of FIG. 5B, which is a structure resulting from Ga atoms being absorbed in the open-core screw dislocation core, has a plurality of energy levels in the bandgap.

Based on these calculation results, it can be concluded that the Ga interstitials that arrive near the dislocation core due to diffusion (including not only thermal phenomena, but also phenomena caused by electric fields) are absorbed in the dislocation core. In other words, a screw dislocation having an open-core screw dislocation core structure, which is electrically neutral, is electrically activated by the absorption of Ga atoms. The calculation results also show that the Ga interstitials absorbed in the Ga-rich screw dislocation core are returned to their original positions even if they are skewed by 0.1 nm from the stable positions.

The above results suggest that the screw dislocation core has an electrically active structure (Ga-rich) and an electrically inactive structure (open-core), and that conduction causes the Ga interstitials remaining in the GaN crystal to be diffused. As a result, the electrically inactive open-core screw dislocation absorbs these Ga interstitials and changes into an electrically active Ga-rich screw dislocation, thereby causing an increase in the leak current. In other words, the leak current increase due to conduction can be thought of as being caused by the Ga interstitials remaining in the GaN crystal. Furthermore, since the Ga atoms absorbed by the screw dislocation are in a stable state, it is believed that the state of the increased leak current is maintained.

Based on the above results, the inventors of the present invention discovered that the leak current increase caused by the long-term operation can be suppressed by suppressing movement of the Ga interstitials toward the screw dislocation core. Therefore, the inventors of the present invention arrived at the conclusion that suppression of the diffusion of the Ga interstitials in the GaN crystal can be suppressed by doping the GaN crystal with an element having greater bonding energy than the self-diffusion energy of the Ga interstitials.

The following describes how the first-principles electronic state calculation was used to check which elements are capable of suppressing diffusion of Ga interstitials, and such elements were given the name "Ga interstitial anchors". The condition required of a Ga interstitial anchor is that, as described above, the bonding energy with Ga interstitials be greater than the self diffusion energy of the Ga interstitials. Furthermore, it is important that the Ga interstitial anchor be stable in the GaN crystal as solute atoms, and the Ga interstitial anchor must have lower cohesive energy than the GaN crystal that does not contain impurity atoms.

In the same manner as the electronic state calculation of the screw dislocations, this calculation was performed using Advance/PHASE produced by Advanced Soft, Ltd. The main calculation conditions were as follows.

Atomic model: A super cell made of 33 atoms (16 Ga atoms, 16 N atoms, and 1 impurity atom)
Cutoff energy: Respectively 25 Ry and 230 Ry for the wave function and the charge density distribution
k-point sample: 3×3×4
Number of calculated hands: 100

Figure 8:
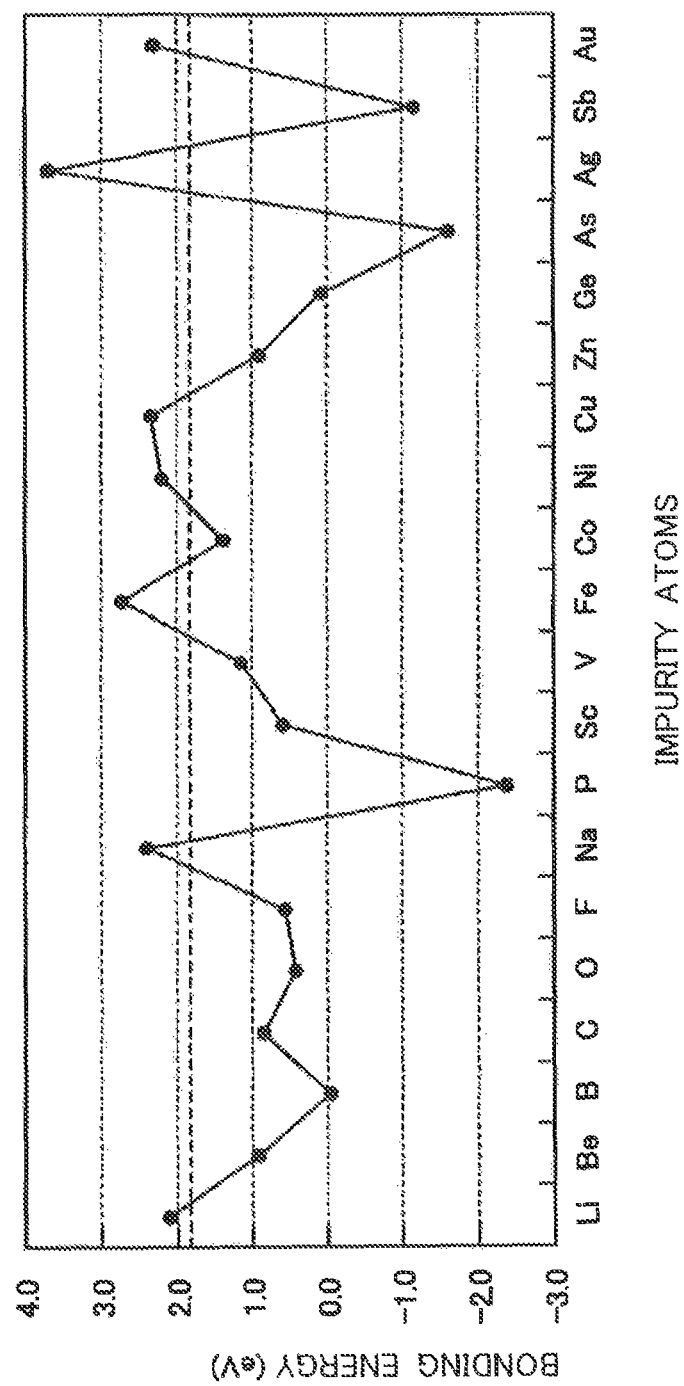
FIG. 8 shows calculated results of bonding energy between an impurity atom and a Ga interstitial atom in GaN crystal for various impurities.

FIG. 8 shows calculated results of the bonding energy between an impurity atom and a Ga interstitial atom in GaN crystal for various impurities. In FIG. 8, the thick dashed line indicates the activation energy for diffusion of the Ga interstitials, obtained by the first-principles electronic state calculation. Impurity atoms with bonding energy above the thick dashed line can act as Ga interstitial anchors. In other words, the impurity atoms with bonding energy above the thick dashed line are stabilized by bonding with the Ga interstitials to form a composite. As a result, the diffusion of the Ga interstitials can be suppressed.

Figure 9:
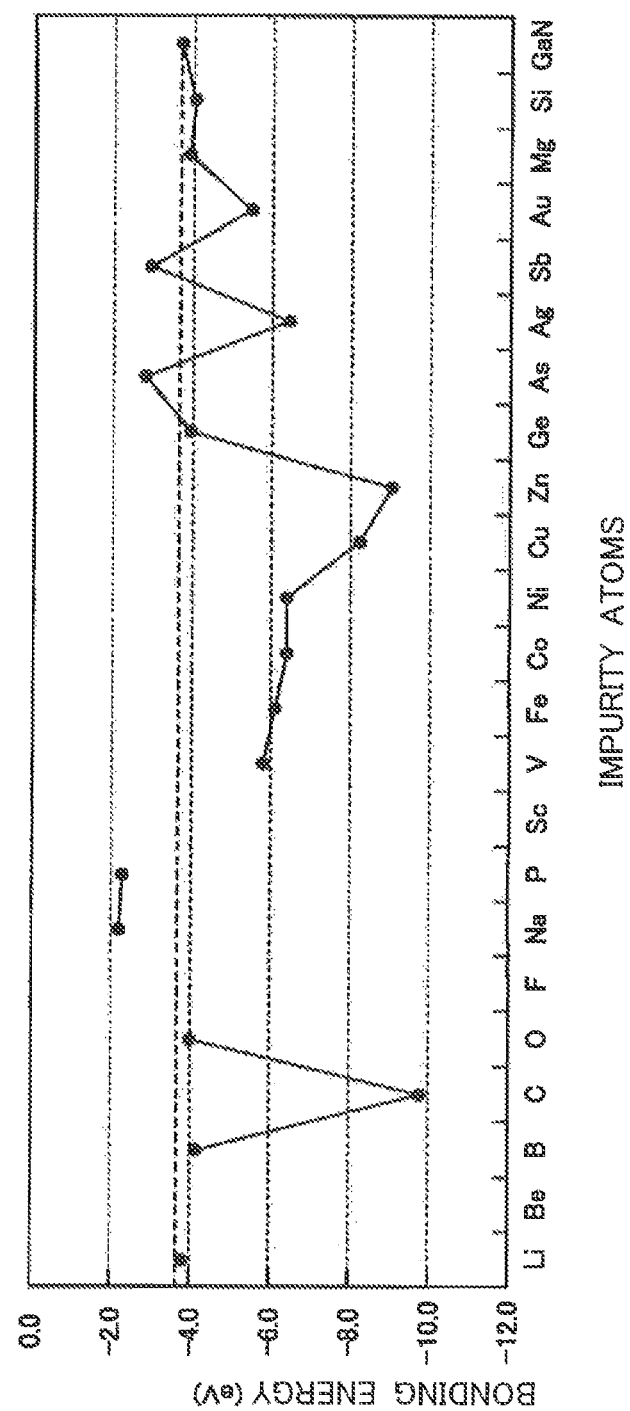
FIG. 9 shows cohesive energy for various atomic numbers when GaN crystal is doped with impurity atoms.

FIG. 9 shows cohesive energy for various atomic numbers when GaN crystal is doped with impurity atoms. In FIG. 9, the thick dashed line indicates cohesive energy of the GaN crystal that does not include impurity atoms. Impurity atoms with cohesive energy at or below the thick dashed line can be stably dissolved in GaN crystal.

FIGS. 8 and 9 show that Li, Fe, Ni, Cu, Ag, and Au can function effectively as Ga interstitial anchors. Based on the above results, the inventors concluded that the increase in the leak current due to the long-term operation can be suppressed by doping these Ga interstitial anchors in the nitride-based compound semiconductor crystal.

Exemplary embodiments of the present invention will be described in detail below with reference to accompanying drawings. However, the embodiments should not be construed to limit the invention. All the combinations of the features described in the embodiments are not necessarily essential to means provided by aspects of the invention. In the drawings, identical or corresponding components are given the same reference numerals. The drawings are schematic views, and relative thicknesses of each layer are not the same as the actual thicknesses. Furthermore, different drawings include portions shown in different dimensional scales.

Figure 10:
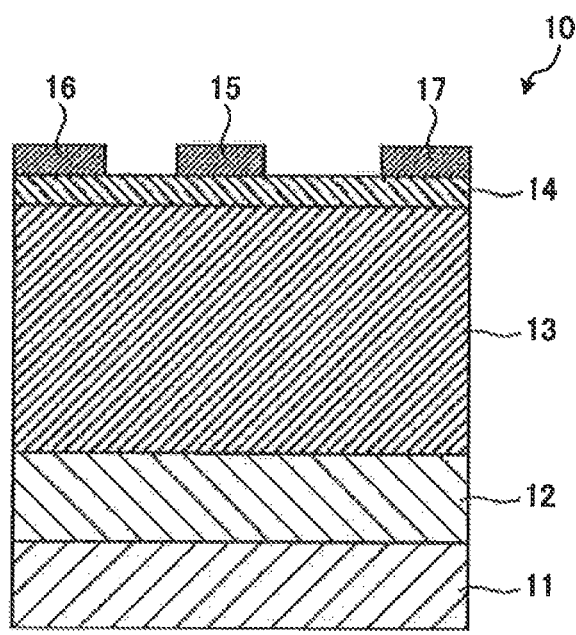
FIG. 10 is a schematic cross-sectional view of an HFET, which is a nitride-based compound semiconductor device according to a first embodiment of the present invention.

FIG. 10 is a schematic cross-sectional view of a heterojunction field effect transistor (HFET) 10, which is a nitride-based compound semiconductor device according to a first embodiment of the present invention. The HFET 10 includes a silicon substrate 11 with the plane (111) as a surface for growing semiconductor layers, which is a heterogeneous substrate. The HFET 10 further includes a buffer layer 12 of GaN, a channel layer 13 of Fe-doped GaN, and an electron supply layer 14 of AlGaN formed sequentially on the silicon substrate 11 in the stated order, and a gate electrode 15, source electrode 16, and drain electrode 17 formed on the electron supply layer 14. In other words, the HFET 10 is an AlGaN/GaN HFET with an AlGaN/GaN heterojunction. The channel layer 13 and the electron supply layer 14 are not intentionally doped with p-type or n-type impurities, but may be doped as desired.

In the HFET 10, the channel layer 13 is doped with Fe. Accordingly, when a bias is applied to the HFET 10, the Fe bonds with the Ga interstitials to form a compound, thereby functioning as a Ga interstitial anchor. Therefore, during the long-term operation, the formation of leak paths toward the silicon substrate 11 from the source electrode 16 or the drain electrode 17 can be prevented. As a result, the increase of leak current in the HFET 10 caused by the long-term operation is suppressed.

The Fe doping concentration is preferably approximately the same as the Ga interstitial concentration in the GaN crystal forming the channel layer 13. As described further below, when the GaN crystal not doped with Fe was epitaxially grown under predetermined conditions and the Ga vacancy density in the GaN crystal was measured using the positron annihilation technique, the Ga vacancy density was from $10^{17}$ $cm^{-3}$ to $10^{18}$ $cm^{-3}$. In this case, the Fe doping concentration is preferably from $5\times10^{16}$ $cm^{-3}$ to $5\times10^{18}$ $cm^{-3}$. When considering reliable bonding with the Ga interstitials, the Fe doping concentration is preferably no less than $1\times10^{17}$ $cm^{-3}$. When considering suppression of deep levels formed by the impurity doping, the Fe doping concentration is preferably no greater than $1\times10^{18}$ $cm^{-3}$.

The following describes an exemplary method for manufacturing the HFET 10 according to the first embodiment. The raw material flow rate, the thickness of each layer, the growth temperature, and the like are merely examples, and do not limit the invention to the description provided in the Specification.

First, trimethyl gallium (TMGa) and ammonia (NH$_3$) are injected into a metal organic chemical vapor deposition (MOCVD) apparatus containing a silicon substrate 11 with respective flow rates of 14 μmol/min and 12 L/min, and a growth temperature of 550° C. is used to epitaxially grow the buffer layer 12 of GaN with a thickness of 30 nm on the silicon substrate 11.

Next, while injecting TMGa and NH$_3$ with respective flow rates of 58 μmol/min and 12 L/min, biscyclopentadienyl iron (Cp$_2$Fe), which is an organic metal, is used as the Fe raw material and injected with a flow rate of 10 sccm, and a growth temperature of 1050° C. is used to epitaxially grow the channel layer 13 of GaN with a thickness of 700 nm on the buffer layer 12. As a result, the channel layer 13 is doped with Fe to a concentration of $2 \times 10^{17}$ cm$^{-3}$.

Instead of Cp$_2$Fe, organic metals such as bisethylcyclopentadienyl (EtCp$_2$Fe) may be used as the Fe organic metal raw material.

Next, trimethyl aluminum (TMAl), TMGa, and NH$_3$ are injected with respective flow rates of 100 μmol/min, 19 μmol/min, and 12 L/min, and a growth temperature of 1050° C. is used to epitaxially grow the electron supply layer 14 of AlGaN with a thickness of 30 nm on the channel layer 13.

Next, titanium (Ti) and Al are sequentially deposited on the electron supply layer 14 to form the source electrode 16 and the drain electrode 17 as ohmic electrodes. Ni and Au are then deposited on a portion between the source electrode 16 and the drain electrode 17 to form the gate electrode 15 as a Schottky electrode. The HFET 10 according to the first embodiment can be manufactured using the manufacturing process described above.

As described above, in the HFET 10 according to the first embodiment, the leak current increase caused by long-term conduction is suppressed.

As a first embodiment example of the present invention, an HFET was manufactured using the manufacturing method of the first embodiment. The Al composition of the electron supply layer of AlGaN was determined to be 0.23 using X-ray analysis. The HFET had a gate length of 2 μm, a gate width of 0.2 mm, and a source-drain spacing of 15 μm.

As a comparative example, an HFET was manufactured in the same manner as the HFET of the first embodiment example, except that the channel layer was not doped with Fe. When manufacturing the HFET of the comparative example, TMGa and NH$_3$ were injected with respective flow rates of 58 μmol/min and 12 L/min, and a growth temperature of 1050° C. was used to epitaxially grow the channel layer of GaN with a thickness of 700 nm on the buffer layer. The Ga vacancy density of the channel layer formed in this way was measured using the positron annihilation technique, and was determined to be approximately from $10^{17}$ cm$^{-3}$ to $10^{18}$ cm$^{-3}$.

Characteristics of the HFET of the first embodiment example were measured, and it was found that the mobility of the 2-dimensional electron gas was 1100 cm$^2$/Vs and the sheet carrier density was $8 \times 10^{12}$ cm$^{-2}$. The mobility and the sheet carrier density of the HFET of the comparative example were the same as the mobility and the sheet carrier density of the HFET of the first embodiment example, indicating that the Fe doping does not affect these characteristics.

Next, the leak currents of the HFET of the first embodiment example and the HFET of the comparative example were measured during the long-term operation. The conduction was performed by applying −5 V between the source and gate and applying 300 V between the source and the drain. The conduction temperature was 175° C.

Figure 11:
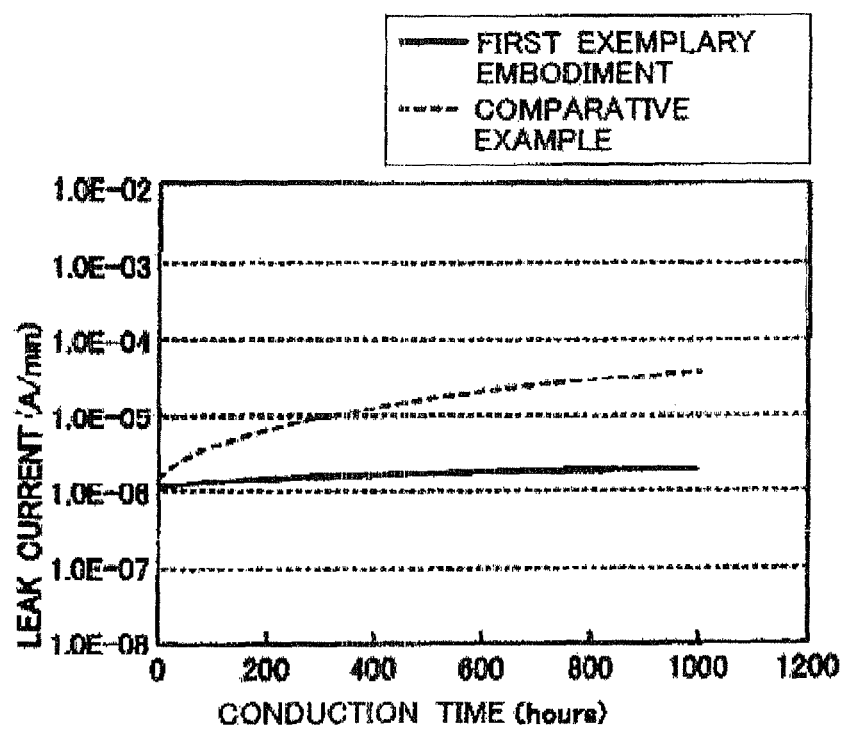
FIG. 11 shows changes of leak currents with time in HFETs according to a first embodiment example and a comparative example.

FIG. 11 shows changes of the leak currents with time in the HFETs according to the first embodiment example and the comparative example. Concerning the value of the leak currents, "E" represents a power of 10, such that "1.0E−6" means "$1.0 \times 10^{-6}$". As shown in FIG. 11, the leak current of the HFET of the comparative example increased by one order of magnitude as a result of 1000 hours of operation, while the leak current of the HFET of the first embodiment example barely increased. The reason for this is believed to be that the Fe atoms substituted in the Ga site in the GaN crystal forming the channel layer bond with the Ga interstitials to form stable compounds, thereby suppressing diffusion of the Ga interstitials to the screw dislocations.

An HFET according to a second embodiment of the present invention is the same as the HFET according to the first embodiment, except that the channel layer is replaced with a layer of Ni-doped GaN.

When a bias is applied to the HFET of the second embodiment, the Ni functions as a Ga interstitial anchor. As a result, in the HFET of the second embodiment, the increase in leak current due to the long-term operation is suppressed.

When manufacturing the HFET of the second embodiment, the step of epitaxially growing the channel layer performed when manufacturing the HFET 10 of the first embodiment involves injecting an organic metal raw material gas containing Ni in addition to the TMGa and NH$_3$. Other growth conditions, such as the flow rates of the TMGa and the NH$_3$, may be the same as the growth conditions used for the HFET 10 of the first embodiment. As a result, the channel layer of Ni-doped GaN is formed.

Allyl (cyclopentadienyl) nickel (AllylCpNi) can be used as the organic metal raw material gas containing Ni. By injecting AllylCpNi with a flow rate of 10 sccm together with the TMGa and the NH$_3$ with the same flow rates as the used for the HFET 10 of the first embodiment, the channel layer can be doped to a Ni concentration of $3 \times 10^{17}$ cm$^{-3}$. Instead of AllylCpNi, biscyclopentadienyl nickel (Cp$_2$Ni) or tetrakis (phosphorous trifluoride) nickel (Ni(PF$_3$)$_4$) can be used as the organic metal raw material gas containing Ni.

As a second embodiment example of the present invention, an HFET was manufactured using the manufacturing method of the second embodiment. The Ni doping concentration was $3 \times 10^{17}$ cm$^{-3}$. The leak current of the HFET of the second embodiment example was measured during long-term conduction, under the same conditions as described in the first embodiment example.

Figure 12:
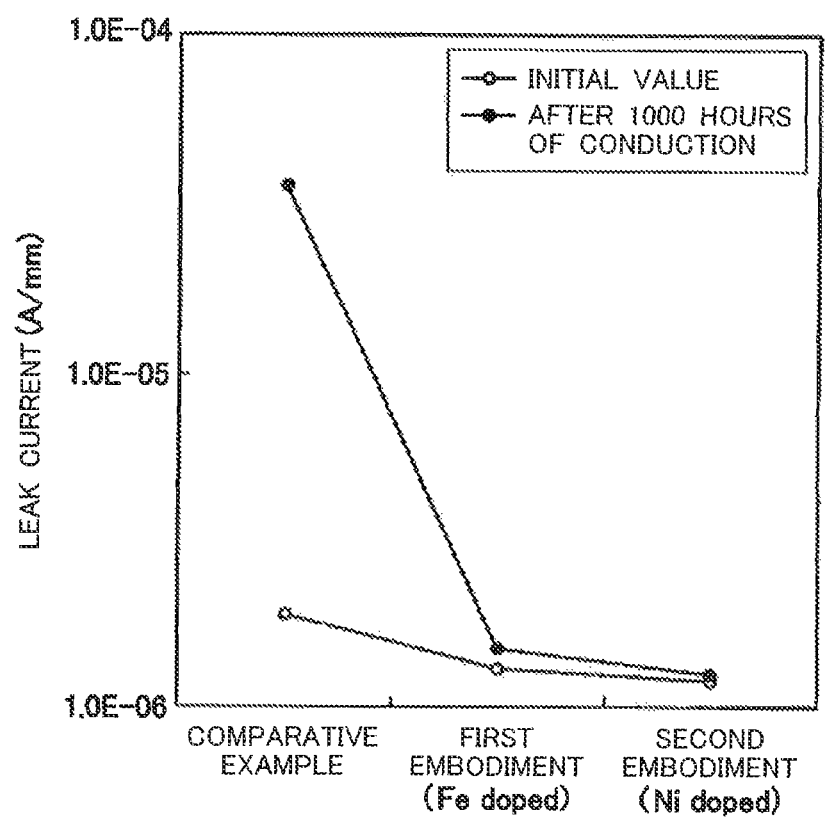
FIG. 12 shows an initial value of the leak current and the leak current after 1000 hours of operation, for HFETs according to the first embodiment example, a second embodiment example, and the comparative example.

FIG. 12 shows the initial value of the leak current, i.e. the leak current when the conduction time is zero, and the leak current after 1000 hours of conduction, for the HFETs of the first embodiment example, the second embodiment example, and the comparative example. As shown in FIG. 12, in the Ni-doped HFET of the second embodiment example, barely any increase in the leak current was seen after 1000 hours of conduction, in the same way as in the HFET of the first embodiment example. This is because the doped Ni atoms form compounds with the Ga interstitials, thereby preventing the diffusion of the Ga interstitials to the screw dislocations.

Furthermore, as shown in FIG. 12, the initial values of the leak currents of the HFETs of the first embodiment example and the second embodiment example are approximately half the initial value of the leak current of the HFET of the comparative example. The reason for this is that deep levels formed by the doped Fe or Ni in the channel layers of the HFETs of the first and second embodiment examples compensate for the remaining carriers in the GaN crystal, and therefore the leak current caused by the remaining carriers is less than if Fe and Ni are not doped.

As described below, the Mossbauer spectroscopy was used to prove that Fe and Ga interstitials form compounds in GaN crystal. Mossbauer spectroscopy is a technique that uses the resonant excitation phenomenon of nuclei to measure electron structure and magnetism near prescribed nuclei.

Using the Mossbauer spectroscopy, a state in which the energy level of a nucleus is shifted due to magnetism or a localized electron structure near the nucleus or a state in which the energy level degenerates causing fission can be accurately measured. In Mossbauer spectroscopy, the strength of resonance scattering or resonance absorption of the target under measurement is measured as a function of the Doppler velocity corresponding to the energy shift amount of radiated gamma rays. The Mossbauer spectrum of the HFET of the first embodiment example was measured before and after conduction. Here, the isomer shift, which depends on the total electron mobility at the nucleus, is important.

FIGS. 13A and 13B show Mossbauer spectra $^{57}$Fe (isotopic abundance of 2.1%) in the HFET of the first embodiment example, as measured using 14.4 keV gamma rays from $^{57}$Co, which is a radioactive isotope. FIG. 13A shows the Mossbauer spectrum of a device immediately after manufacturing and prior to conduction. FIG. 13B shows the Mossbauer spectrum of the device alter 100 hours of conduction. Since Mossbauer spectroscopy is highly sensitive, it is possible to detect a signal even when the isotopic abundance is low. Furthermore, in this measurement, the detection of gamma rays was achieved using a NaI(Tl) scintillation counter and a Ge detector.

The peaks P1 near a Doppler velocity of 0 mm/s are caused by single Fe replacing the Ga sites. The peaks P2 near a Doppler velocity of 0.5 mm/s are caused by compounds of Fe and Ga interstitials replacing the Ga sites. Comparing FIGS. 13A and 13B, it is seen that the peak caused by single Fe is dominant in the device prior to conduction and the peak caused by the compounds of Fe and Ga interstitials is dominant in the device after 100 hours of conduction. This change in the Mossbauer spectrum shows that the Fe and Ga interstitials are independent prior to conduction, but after conduction, the Ga interstitials that began to be diffused by the heat and voltage stress during conduction are trapped by the Fe to form compounds.

The above description relates to a method for detecting compounds of Fe and Ga interstitials, but confirmation of compounds of Ni and Ga interstitials can be performed as well. In this case, the Mossbauer spectroscopy using, as a gamma ray source (energy of −67.4 keV), $^{61}$Co manufactured by irradiating $^{64}$Ni with a proton beam with an energy of 22 MeV can be used to confirm whether compounds are formed by $^{61}$Ni (isotopic abundance of 0.9%) and Ga interstitials in GaN crystal.

As shown in FIG. 9, the Fa and Ni have relatively low cohesive energy, and are therefore easily dissolved in GaN. Accordingly, Fe and Ni can be doped by diffusion. The following describes an HFET whose channel layer is doped with Fe by diffusion, as a third embodiment of the present invention.

FIG. 14 is a schematic cross-sectional view of an HFET 20 according to a third embodiment of the present invention. As shown in FIG. 14, the HFET 20 includes a silicon substrate 11 and a buffer layer 12 of GaN, a channel layer 23 of GaN doped with Fe by diffusion, and an electron supply layer 14 of AlGaN, formed sequentially on the silicon substrate 11 in the stated order. The HFET 20 further includes a gate electrode 15, a source electrode 16, and a drain electrode 17 formed on the electron supply layer 14. In other words, the HFET 20 is the same as the HFET 10 of the first embodiment, except that the channel layer 13 is replaced with the channel layer 23 of GaN doped with Fe by diffusion.

In FIG. 14, the profile P indicates the Fe concentration distribution in the channel layer 23. As shown by the profile P, Fe is distributed such that the concentration peaks near the center of the channel layer 23 in the thickness direction.

When a bias is applied to the HFET 20, the Fe functions as a Ga interstitial anchor, and therefore the leak current increase caused by long-term conduction is suppressed.

Figure 15A:
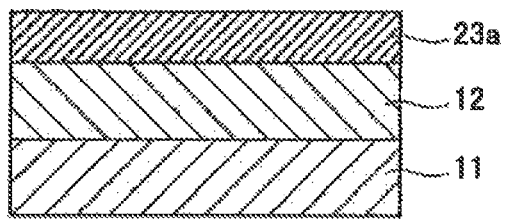

FIGS. 15A to 15D show an example of a process for manufacturing the HFET 20 shown in FIG. 14. First, in the same manner as the manufacturing method of the HFET 10 of the first embodiment, the buffer layer 12 is epitaxially grown on the silicon substrate 11. Next, a GaN layer 23a with a thickness of 400 nm, which serves as a portion of the channel layer 23, is epitaxially grown on the buffer layer 12 (FIG. 15A).

Figure 15B:
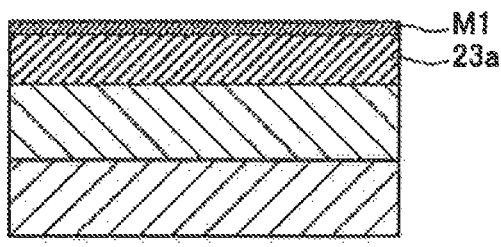

Next, the epitaxial substrate on which the GaN layer 23a is formed is removed from the MOCVD apparatus and placed in a sputtering apparatus. Fe (purity of 99.99%) is used as a target, and an Fe film M1 with a thickness of 100 nm is formed on the GaN layer 23a by high-frequency sputtering with chamber pressure of 0.5 Pa to 2 Pa and power of 30 W to 100 W (FIG. 15B).

Figure 15C:
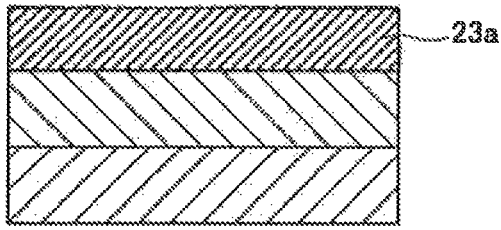

After forming the Fe film M1, the epitaxial substrate is thermally processed in a 99.9999% pure argon atmosphere for 1 hour at a temperature from 500° C. to 700° C., thereby diffusing the Fe in the GaN layer 23a. After the thermal processing, the Fe film M1 remaining on the surface of the GaN layer 23a is removed using hydrochloric acid with normality of 1.0 (FIG. 15C).

Figure 15D:
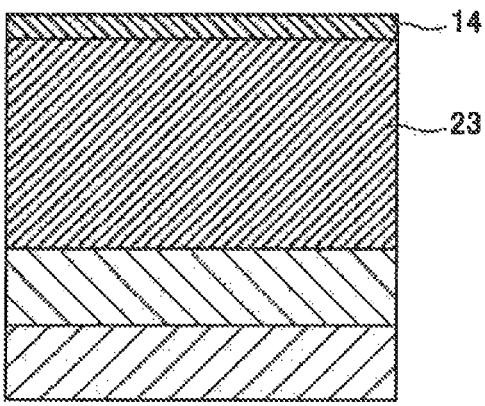

After this, the epitaxial substrate is returned to the MOCVD apparatus. The GaN layer is further epitaxially grown by 300 nm to form the channel layer 23, and the electron supply layer 14 is then formed (FIG. 15D). Here, when growing the GaN layer 23a, in order to heat the epitaxial substrate to 1050° C., the Fe atoms diffused in the GaN layer 23a are diffused toward the top and bottom surfaces according to the growth of the GaN layer. As a result, Fe can be doped across the entire channel layer 23.

After the epitaxial growth is finished, the electrodes are formed in the same manner as in the first embodiment. The HFET 20 of the third embodiment can be manufactured by the manufacturing method described above. The HFET of the third embodiment was manufactured using the above manufacturing method and the leak current thereof was measured during long-term conduction, under the same conditions as described in the first embodiment. An increase of the leak current was not seen in the measurement results.

Fe was doped by diffusion in the HFET of the third embodiment, but Ni can be doped in the same way. The leak current of an HFET manufactured by doping Ni by diffusion does not increase.

The above embodiments are HFETs in which AlGaN/GaN is thrilled on a silicon substrate, which is a different type of substrate, but the type of substrate used is not limited to this. For example, the same effect can be achieved using a sapphire ($Al_2O_3$), silicon carbide (SiC), or zinc oxide (ZnO) substrate, in the above embodiments, the Ga interstitial anchor used for doping is Fe or Ni, but both Fe and Ni may be used together. The present invention may also be a sub-combination of the features described above.

The nitride-based compound semiconductor device according to the present invention is not limited to an HFET, and may instead be another type of device. The nitride-based compound semiconductor device may be a Schottky barrier diode or a MOSFET. In the nitride-based compound semiconductor device of the present invention, the Fe functioning as the Ga interstitial anchor is preferably added in the nitride-based compound semiconductor layer in which formation of a leak path is possible and positioned between the substrate and the operational regions. Furthermore, the nitride-based compound semiconductor device of the present invention may be a semiconductor other than GaN, as long as the nitride-based compound semiconductor includes nitrogen atoms and one or more group-III atoms selected from Al, Ga, In, and B.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can provide a nitride-based compound semiconductor and a nitride-based compound semiconductor device that have high long-term reliability.

What is claimed is:

1. A nitride-based compound semiconductor, comprising:
a substrate;
a buffer layer formed on the substrate; and
a channel layer including gallium nitride (GaN) and formed on the buffer layer, wherein
a Ga vacancy density in the channel layer is no less than $10^{17}$ cm$^{-3}$ and no greater than $10^{18}$ cm$^{-3}$,
impurity atoms of a metal are doped across the entire channel layer, each of the impurity atoms having, in a GaN crystal of the channel layer, a bonding energy with a Ga interstitial atom that is greater than an activation energy for diffusion of the Ga interstitial atom and a cohesive energy that is equal to or lower than a cohesive energy of the GaN crystal without the impurity atom,
at least one of the impurity atoms forms a compound with at least one Ga interstitial atom in the GaN crystal of the channel layer,
the buffer layer does not contain impurity atoms of the metal,
the metal is Fe, and
a doping concentration of the impurity atoms is no less than $5\times10^{16}$ cm$^{-3}$ and no greater than $5\times10^{18}$ cm$^{-3}$.

2. The nitride-based compound semiconductor according to claim 1, wherein the doping concentration of the impurity atoms is equal to a concentration of Ga interstitial atoms in the GaN crystal of the channel layer.

3. The nitride-based compound semiconductor according to claim 1, wherein the doping concentration of the impurity atoms is no less than $1\times10^{17}$ cm$^{-3}$ and no greater than $1\times10^{18}$ cm$^{-3}$.

4. A nitride-based compound semiconductor device, comprising:
a heterogeneous substrate with respect to a nitride-based compound semiconductor;
a buffer layer formed on the substrate; and
a channel layer including the nitride-based compound semiconductor formed on the buffer layer, wherein
the nitride-based compound semiconductor includes gallium (Ga) interstitial atoms,
nitrogen atoms, and
impurity atoms of a metal, at least one of the impurity atoms forming a compound with at least one of the Ga interstitial atoms,
a Ga vacancy density in the channel layer is no less than $10^{17}$ cm$^{-3}$ and no greater than $10^{18}$ cm$^{-3}$,
the impurity atoms are doped across the entire nitride-based compound semiconductor of the channel layer, the at least one impurity atom having, in a nitride-based compound semiconductor crystal of the channel layer, a bonding energy with the corresponding Ga interstitial atom that is greater than an activation energy for diffusion of the Ga interstitial atom and a cohesive energy that is equal to or lower than a cohesive energy of the nitride-based compound semiconductor crystal without the impurity atom,
the buffer layer does not contain impurity atoms of the metal,
the metal is Fe, and
a doping concentration of the impurity atoms is no less than $5\times10^{16}$ cm$^{-3}$ and no greater than $5\times10^{18}$ cm$^{-3}$.

5. The nitride-based compound semiconductor device according to claim 4, wherein the substrate includes at least one selected from the group consisting of Si, Al$_2$O$_3$, SiC, and ZnO.

6. The nitride-based compound semiconductor device according to claim 4, wherein the doping concentration of the impurity atoms is equal to a concentration of the Ga interstitial atoms in the nitride-based compound semiconductor crystal of the channel layer.

7. The nitride-based compound semiconductor device according to claim 4, wherein the doping concentration of the impurity atoms is no less than $1\times10^{17}$ cm$^{-3}$ and no greater than $1\times10^{18}$ cm$^{-3}$.

8. The nitride-based compound semiconductor device according to claim 1, further comprising:
an electron supply layer of AlGaN formed on the channel layer; and
a plurality of electrodes formed on the electron supply layer.

9. The nitride-based compound semiconductor device according to claim 4, further comprising:
an electron supply layer of AlGaN formed on the channel layer; and
a plurality of electrodes formed on the electron supply layer.

10. A nitride-based compound semiconductor, comprising:
a substrate;
a buffer layer formed on the substrate; and
a channel layer including gallium nitride (GaN) and formed on the buffer layer, wherein
the channel layer is doped with impurity atoms of an element having
a bonding energy higher than a self-diffusion energy of a Ga interstitial atom in the channel layer, and
a cohesive energy that is equal to or lower than a cohesive energy of a GaN crystal of the channel layer without the element, wherein
a Ga vacancy density in the channel layer is no less than $10^{17}$ cm$^{-3}$ and no greater than $10^{18}$ cm$^{-3}$,
at least one of the impurity atoms forms a compound with at least one Ga interstitial atom in the GaN crystal of the channel layer,
the buffer layer does not contain the element, and
a doping concentration of the element is no less than $5\times10^{16}$ cm$^{-3}$ and no greater than $5\times10^{18}$ cm$^{-3}$.

* * * * *